United States Patent [19]
Marshall

[11] Patent Number: 4,696,055
[45] Date of Patent: Sep. 22, 1987

[54] RF TUNING CIRCUIT WHICH PROVIDES IMAGE FREQUENCY REJECTION

[75] Inventor: Christopher B. Marshall, Horley, United Kingdom

[73] Assignee: U.S. Philips Corporation, New York, N.Y.

[21] Appl. No.: 809,694

[22] Filed: Dec. 17, 1985

[30] Foreign Application Priority Data

Dec. 19, 1984 [GB] United Kingdom ............... 8432010

[51] Int. Cl.$^4$ .................... H04B 1/04; H04B 1/26; H04B 1/10
[52] U.S. Cl. ................................ 455/118; 455/126; 455/260; 455/302; 455/306; 307/512; 307/521; 328/167
[58] Field of Search ............... 455/109, 119, 126, 118, 455/260, 265, 302, 304, 306, 307, 207; 307/512, 520, 521; 328/166, 167

[56] References Cited

U.S. PATENT DOCUMENTS

| | | | |
|---|---|---|---|
| 3,141,134 | 7/1964 | Osborne et al. | 455/118 |
| 3,624,513 | 11/1971 | Costas | 455/302 |
| 3,744,015 | 7/1973 | Marimon et al. | 455/307 |
| 4,408,351 | 10/1983 | Maurer et al. | 455/260 |
| 4,476,585 | 10/1984 | Reed | 455/207 |

OTHER PUBLICATIONS

"Network Theory", Edited by Boite, Authored by Saraga.

Primary Examiner—Jin F. Ng
Attorney, Agent, or Firm—Thomas A. Briody; Jack Oisher; William J. Streeter

[57] ABSTRACT

A radio frequency tuning circuit, for use in a transmitter or receiver, which rejects image frequencies of the frequency band of a supplied RF signal to which it is tuned. The circuit comprises an N-path filter and a feedback loop connecting the output of such filter to the input of an RF amplifier to which the RF signal is applied. The filter includes a tunable local oscillator and a pair of quadrature related signal paths including mixers therein driven by such oscillator, the outputs of such paths being combined by a summing amplifier which produces the output RF signal. The output of the summing amplifier is also supplied to the feedback path, causing the center frequency of the transfer characteristic of the N-path filter to be displaced from the local oscillator frequency. The RF output signal thereby includes substantially only single sideband of the signals produced by the two signal paths.

8 Claims, 16 Drawing Figures

RF TUNING CIRCUIT WHICH PROVIDES IMAGE FREQUENCY REJECTION

BACKGROUND OF THE INVENTION

1. Field of the Invention

The present invention relates to radio receiver/transmitter filters having particular application to the problem of image rejection.

2. Description of the Related Art

Superheterodyne radio receivers are well known and amongst other things are characterised by the r.f. signal being applied to an i.f. stage which includes a mixer to which a local oscillator signal is applied. The products of mixing include the wanted signal and an unwanted image signal. Generally the image frequency is removed using L/C filters prior to mixing. However such filters do not readily lend themselves to fabrication as integrated circuits because of the need for an inductance. Although inductances can be simulated by gyrators it is difficult to obtain the required output power at VHF and UHF frequencies. In any event such filters do not lend themselves to accurate operation at high frequencies. In order to avoid this problem filter designers have attempted to use oscillators in filter circuits. W. Saraga in "Some Aspects of N-path and Quadrature Modulation Single-Sideband Filters" published in Network Theory, edited by R. Boite and published by Gorden and Breach discloses using quadrature modulation for single sideband generation. In one example two sets of quadrature mixers are used, each set being supplied with the same or different local oscillator signals. It has also been suggested by W. Saraga that the centre frequency of an N-path filter can be shifted away from the local oscillator frequency by means of feedback which will also increase the magnitude of the wanted signal relative to that of the unwanted image signal.

If these teachings of Saraga are used to provide an r.f. filter with its centre frequency moved away from the local oscillator frequency, then an additional mixer with its associated local oscillator would be required for mixing the signal to the i.f. The drawbacks to doing this are that not only would such an additional mixer involve more components but also mixers are power consuming parts of a circuit and furthermore they degrade the dynamic range of the circuit performance.

SUMMARY OF THE INVENTION

An object of the present invention is to provide a radio receiver which has good image signal rejection.

According to one aspect of the present invention there is provided a radio receiver including a tunable N-path filter having an oscillator, the centre frequency of which filter is displaced from the oscillator frequency through the use of feedback thus providing image rejection.

A second mixing operation may be avoided by taking an output (i.f.) signal from the low frequency section of the N-path filter. In an embodiment of the present invention the output signal is derived from the output of the low pass filter. In another embodiment the quadrature outputs available at the low frequency sections of both the I and Q paths of the N-path filter are used as inputs for a polyphase filter. Polyphase filters have a filter characteristic which is asymmetrical about zero and in consequence can be used to realise a filter with an asymmetric transfer function.

If desired an additional polyphase filter may be connected to a low frequency point in the I and Q paths to provide additional image attenuation in the i.f. signals derived from the low frequency section of the N-path filter. Thus if each filter provides a minimum image attenuation of 30 dB then an overall attenuation of 60 dB or more can be achieved.

According to another aspect of the present invention there is provided a radio transmitter including a tunable N-path filter having an oscillator, the centre frequency of which filter is displaced from the oscillator frequency through the use of feedback thus avoiding the generation of an image frequency transmission.

BRIEF DESCRIPTION OF THE DRAWINGS

The present invention will now be described, by way of example, with reference to the accompanying drawings, wherein:

FIGS. 9A to 11A are s-plane diagrams and the associated FIGS. 9B to 11B are amplitude/frequency diagrams.

DESCRIPTION OF THE PREFERRED EMBODIMENT

Figure 1:
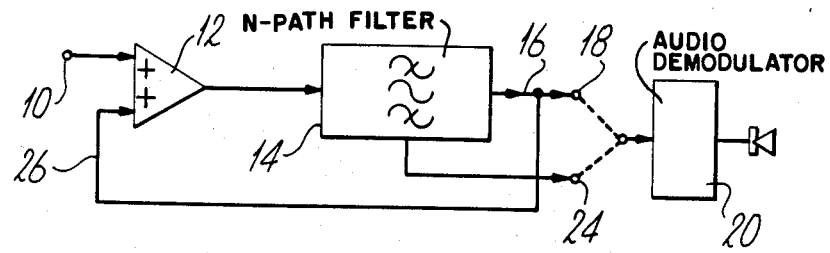
FIG. 1 is a block schematic circuit diagram of a radio receiver made in accordance with the present invention.

In the drawings corresponding reference numerals have been used to indicate the same parts. Also in the interests of brevity, the filters will be described in the context of radio receivers and an illustrative example of the use of such filters in a transmitter will be given.

Referring to FIG. 1 the radio receiver comprises an input 10 coupled to an input of a summing arrangement which in the illustrated embodiment is an r.f. amplifier 12. The output of the amplifier 12 is connected to a tunable N-path filter 14. An output 16 of the filter 14 is fed back to a summing input of the amplifier 12.

The output 16 on which in use, a filtered r.f. signal is present, is connected to a terminal 18 to which the remainder 20 of the receiver, for example the demodulator and audio amplifier, is connected via an r.f. mixer. Alternatively an output terminal 24 is connected to a low frequency section of the filter 14 by which an i.f. signal having an attenuated image is derived and applied to the remainder 20 of the receiver. The output 16 is coupled by a feedback loop 26 to a second summing input of the amplifier 12.

In operation if one initially ignores the feedback loop 26 then an r.f. input signal is amplified in the amplifier 12 and applied to the tunable N-path filter 14. The output from the filter will include the wanted r.f. signal and its image which is unwanted and has to be removed by an image filter. The effectiveness of the N-path filter in passing the wanted signal and rejecting the image signal is improved by providing the feedback loop 26. The signal feedback is used to shift the response frequency away from the frequency of the local oscillator in the filter 14 in a direction towards the wanted signal. Consequently either the need for an image signal filter is avoided or, if provided, its specification is less severe.

By taking an i.f. signal from the output 24 the need for a second mixing operation to obtain an i.f. signal is avoided.

Figure 2:
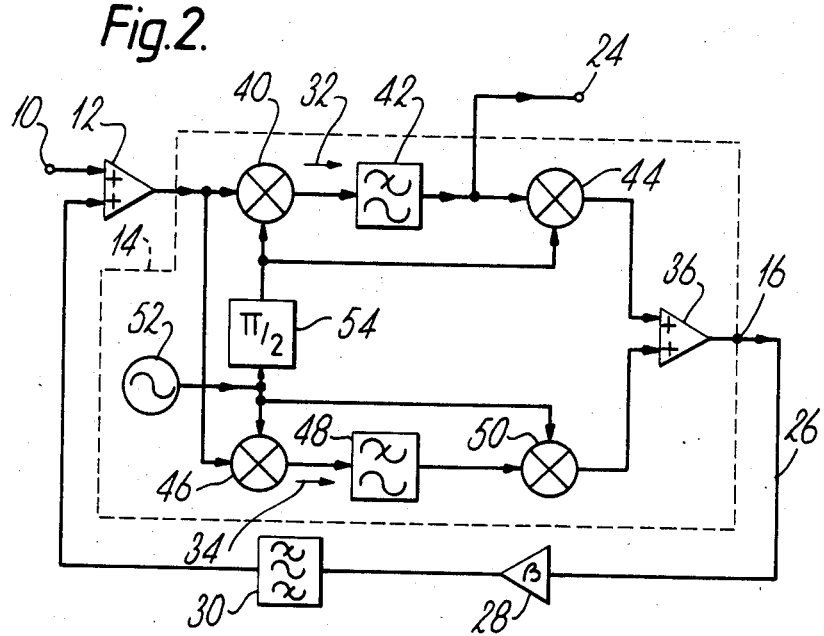
FIG. 2 is a more detailed circuit diagram of an embodiment of the r.f. section of a radio receiver made in accordance with the present invention having a tunable quadrature modulation N-path filter.

FIG. 2 shows in greater detail the r.f. section and the construction of an embodiment of an N-path filter. The circuit comprises the r.f. summing amplifier 12 having one input connected to a signal input terminal 10 and another input for a feedback signal from the tunable filter 14. The feedback loop 26 from the output 16 of the tunable filter 14 may include a feedback amplifier 28 and/or a bandpass filter 30.

The illustrated tunable filter 14 comprises first and second signal paths 32, 34 connected between the output of the r.f. amplifier 12 and respective inputs of a summing amplifier 36. The first signal path 32 includes a first mixer 40 whose output is connected by way of a low pass filter 42 to an input of a second mixer 44 whose output is connected to one input of the summing amplifier 36. The output terminal 24 is connected to the output of the low pass filter 42 but may be connected to another part of the low frequency section of the filter 14. The second signal path 34 comprises a third mixer 46 whose output is connected by way of another low pass filter 48 to a signal input of a fourth mixer 50 whose signal output is connected to a second input of the summing amplifier 36.

The second inputs to the mixers 40, 44, 46 and 50 constitute reference signal inputs. In the illustrated embodiment the reference signals are derived from a signal generator, for example a crystal oscillator or a frequency synthesiser, which for ease of description will be referred to as a local oscillator 52. The local oscillator 52 is connected directly to the second inputs of the third and fourth mixers 46, 50. A phase shifter 54 is connected to the output of the local oscillator 52. An output of the phase shifter 54 is connected directly to the second inputs of the first and second mixers, 40, 44. The phase shift between the local oscillator signals for the two paths should be close to 90°.

Figure 4:
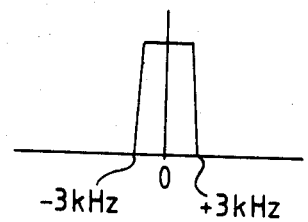
Figure 5:
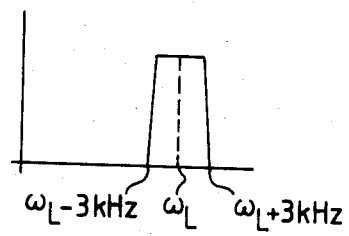

The operation of an N-path filter such as the filter 14 prior to the introduction of feedback will now be described with reference to FIGS. 3 to 5 of the accompanying drawings.

Figure 3:
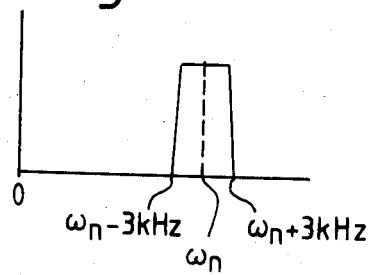
FIGS. 3 to 5 are diagrams for explaining the operation of the N-path filter.

FIG. 3 illustrates an incoming modulated r.f. signal centred on a carrier frequency $\omega_n$ with its sidebands extending 3 kHz above and below the carrier signal $\omega_n$. The frequency $\omega_L$ of the local oscillator 52 corresponds to $\omega_n$ so that in each of the mixers 40, 46 the incoming signal is mixed down to base band as shown in FIG. 4. The signals applied to the two identical low pass filters 42, 48 are in quadrature and at audio frequencies. Consequently, the audio frequency signals are easier to filter than at r.f. and also it is possible to construct a base band filter as an integrated circuit as the use of inductors can be avoided. The signals applied to the filter include the modulation signal mixed down to baseband together with the unwanted signals which can be removed by the filters 42, 48.

Thereafter the outputs are frequency up-converted by means of the mixers 44, 50 so that the signals emerge at their original frequency. Unwanted products are produced by the mixing operation but since these are out-of-phase whereas the wanted signals are in-phase, the unwanted products can be removed by summation in the amplifier 36. The output from the amplifier 36 is the input signal filtered according to the filters 42, 48 see FIG. 5, this signal being substantially free of unwanted components. By translating or remodulating base band signals on the local oscillator frequency then the r.f. output signal is reproduced at the original carrier frequency, with unwanted signals having been attenuated by the action of the filters.

As an example, if it is assumed that the input signal with angular frequency $\omega_n$ comprises $a.e^{j\omega t}$ then it can be shown that the output from the amplifier 36 is $a.e^{j\omega t}[-F(\omega_n+\omega_L)+F(\omega_n-\omega_L)]$. Consequently, since the input terms are present in the output then it can be shown that the overall filtering function $F'(\omega)$ is $[-F(\omega_n+\omega_L)+F(\omega_n-\omega_L)]$, the spurious generation of an unwanted signal at a frequency of $(2\omega_L-\omega_n)$ by the mixers can be ignored as it has been cancelled in the summation at the amplifier 30 as described above. It is also evident that the filtering function is valid for positive and negative values of $\omega_n$.

In order to obtain a satisfactory performance of the filter it is necessary to ensure that the mixers are balanced to minimise breakthrough and also the low pass filters should have closely matched phase and amplitude.

Turning now to the application of feedback and the i.f. stage shown in full in FIG. 2. The presence of the summing arrangement 12 and the feedback loop 26 means that it is possible to implement a stage having a narrow radio frequency passband which is then offset in frequency by the application of feedback. The overall loop gain is critical and should be of the order of unity. A factor affecting the overall loop gain is the product of the gains of the r.f. amplifier 12 and the feedback amplifier 28. In order to obtain this unity figure the r.f. amplifier 12 can be an attenuator whilst the feedback amplifier 28 has a gain greater than unity, and vice versa.

The transfer function of the overall i.f. stage to the r.f. feedback becomes $[AF'(\omega_n-\omega_L)]/[1-A.\beta.G(\omega_n)F'(\omega_n-\omega_L)]$, the maximum of which at $\omega_0$ can be offset from the local oscillator frequency $\omega_L$. The same transfer function also applies to the i.f. output on the terminal 24 and therefore peaks at an output frequency $\omega_{if}$ which equals $(\omega_0-\omega_L)$ where $\omega_0$ may be greater or less than $\omega_L$ and is produced as a result of feedback. In the above transfer function A is the gain of the r.f. amplifier 12, $\beta$ is the gain of the amplifier 28, $G(\omega_n)$ is the response of any r.f. filtering in the feedback path. $F'(\omega_n-\omega_L)$ is the transfer function of the tunable filter 14, in this case $\omega_n$ and $\omega_L$ are different frequencies $\omega_o$ will normally be equal to $\omega_n$ so that the wanted and image signals pass through the low frequency section of the filter at a frequency of $\omega_{if}=\omega_n-\omega_L$.

Figure 6:
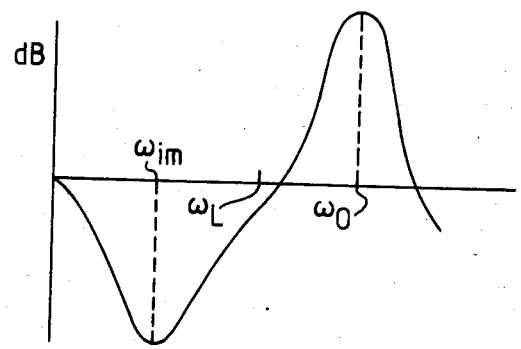
FIGS. 6 and 7 are diagrams for explaining the overall operation of the circuit.
Figure 7:
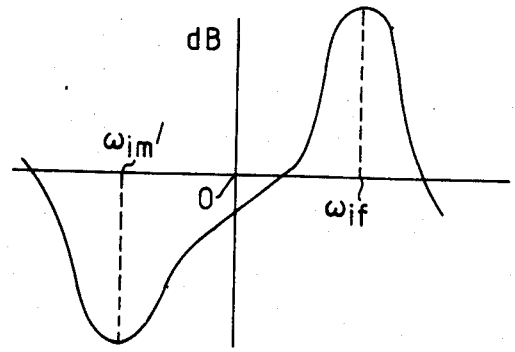

The block behaviour of the i.f. stage is illustrated in FIG. 6 (the output of the filter 14) whilst the behaviour in the low frequency section is illustrated in FIG. 7. In FIG. 6 the image frequency $\omega_{im}=2\omega_L-\omega_n$, the image output being reduced typically by 30 dB, and perhaps up to 50 dB, and in FIG. 7 the image frequency $\omega_{im}'=-\omega_{if}$.

The i.f. stage is tunable by adjusting the frequency of the local oscillator 52 and can operate with any type of modulation.

Figure 8:
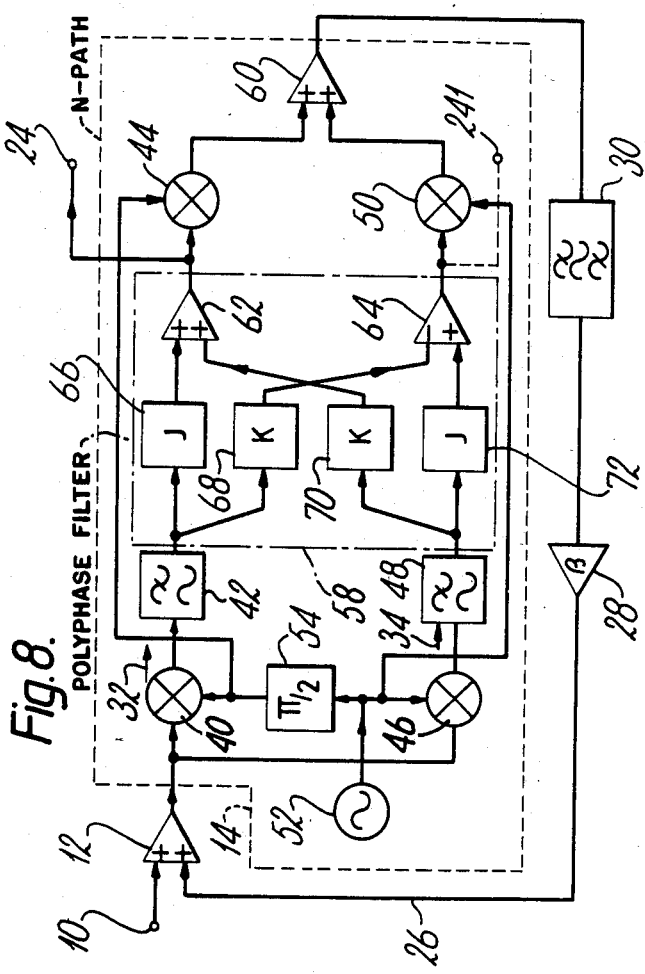
FIG. 8 is a more detailed circuit diagram of another embodiment of the r.f. section of a radio receiver made in accordance with the present invention having polyphase filters.

Whilst the above approach can be made to give image rejection, more flexibility in the design can be obtained by including polyphase filters within the low frequency section of the N-path filter 14. Such an arrangement is shown in FIG. 8. The illustrated circuit comprises quadrature channels 32, 34 but differs from the previously described circuit by having a two input polyphase filter 58 connected to the outputs of the filters 42, 48. The i.f. signal output 24 is produced at one of the low frequency outputs of the polyphase filter 58. If a quadrature pair of i.f. outputs is required then as shown in broken lines the output of the amplifier 64 could also be used, which output is produced at a terminal 241. The two outputs of the filter 58 are connected to respective mixers 44, 50 whose outputs are connected to the inputs of a summing amplifier 60. As with the embodiment of FIG. 2 the output of the local oscillator 52 and the phase shifter 54 are connected respectively to the mixers 50 and 44.

The illustrated polyphase filter 58 comprises a two input summing amplifier 62 and a two input difference amplifier 64. The outputs of the amplifiers 62, 64 are connected to respective inputs of the mixers 44, 50. The output of the low pass filter 42 is connected by filtering circuits 66, 68 to an input of the amplifier 62 and to the inverting input of the amplifier 64, respectively. The output of the low pass filter 48 is connected by filtering circuits 70, 72 to the other inputs of the amplifiers 62, 64, respectively. The response $J(\omega)$ produced by the circuits 66, 72 is the same and may typically be constant and the response $K(\omega)$ produced by the circuits 68, 70 is the same and may typically vary with frequency $\omega$. The overall transfer characteristic $F(\omega)$ of the polyphase filter 58 is $$F(\omega)=J(\omega)+jK(\omega)$$

and the filter produces an asymmetric zero. For example, with such an arrangement then taking the signal in the channel 32 as being the I signal and that in the channel 34 as the Q signal, there being a relative phase shift of 90° between the I and Q signals, if the Q signal lags the I signal by 90° then the phase shifter 70 adjusts the phase of the Q signal by further 90° to bring it into antiphase with the I signal so that the inputs on the amplifier 62 are added to produce a zero output. Conversely when the I signal lags the Q signal then the phase shifter 70 causes the Q signal to be brought into phase with the I signal so that the output of the amplifier 62 is a double amplitude signal. The phase shifter 68 produces a similar effect by shifting the phase of the I signal by 90° and the difference of the signals at the inputs of the amplifier 64 is produced. The outputs of the amplifiers 62, 64 are frequency converted in the mixers 44, 50 and then added in the amplifier 60.

Figure 9A:
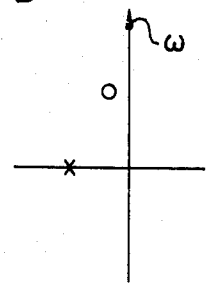
Figure 9B:
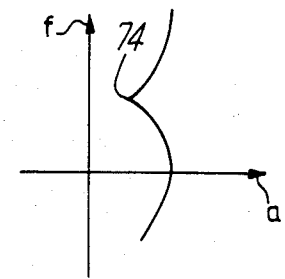
Figure 10A:
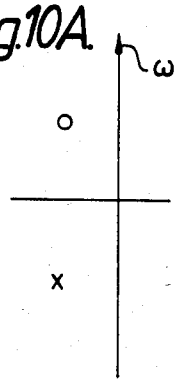
Figure 10B:
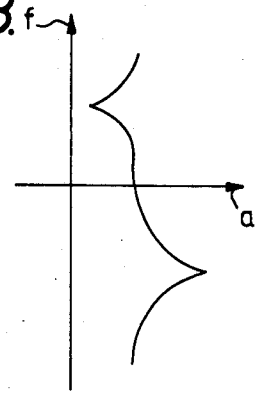
Figure 11A:
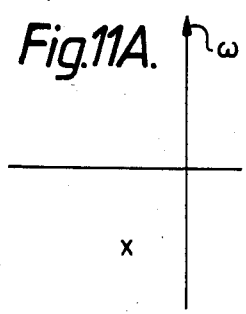
Figure 11B:
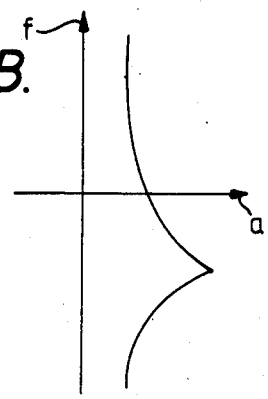

Without feedback, the polyphase filter 58 produces an asymmetric zero and symmetrical pole as shown in FIG. 9A. The drawing is an s-plane diagram in which the ordinate is frequency, $\omega$, and a pole is denoted by X and a zero by 0. The curve in FIG. 9B represents the amplitude, a, /frequency, f, response, the reference numeral 74 denoting the minimum amplitude which occurs at the zero in FIG. 9A. The amplitude A at any frequency being given by $$A = \frac{\text{Product of the distance to zero(s)}}{\text{Product of distances to the pole(s)}}$$

Thus in FIGS. 9A to 11A as one moves along the ordinate which represents frequency the amplitude drops as the zero is approached, and peaks in the vicinity of a pole. Adding the feedback loop 26 gives asymmetric poles as shown by way of example in FIGS. 10A and 11A and provides the associated amplitude/frequency responses shown in FIGS. 10B and 11B. If the overall filter has a sufficiently narrow bandwidth then the anti-image filtering stage can also contribute to the adjacent channel rejection.

Figure 12:
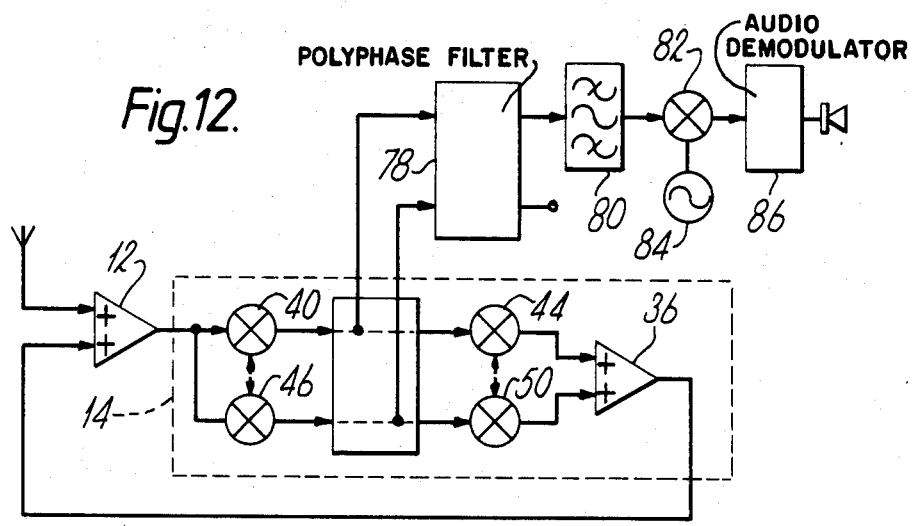
FIG. 12 is a block schematic circuit diagram of a radio receiver in which additional polyphase filtering is provided.

FIG. 12 illustrates an r.f. receiver of which the front end has an N-path filter 14, shown diagrammatically, which may be constructed as shown in FIG. 2 or FIG. 8, and an additional polyphase filter 78 connected to the quadrature related paths in the low frequency section of the filter 14. The signal inputs to the polyphase filter 78 comprise a quadrature related pair of i.f. signals with images attenuated by 30 dB or more. Additional attenuation of the image signals by another 30 dB or more is made possible by the filter 78 which may be similar in construction to the filter 58 in FIG. 8. Only one of the outputs of the filter 78 is required for further signal processing and in the illustrated arrangement this is coupled to a band pass filter 80 which passes the i.f. signal and removes the adjacent channel signals. Frequency down-(or up-) conversion of the filtered signal can be carried-out in a mixer 82 to which a local oscillator 84 is connected and the signal can then be demodulated by a stage 86 of conventional design.

Figure 13:
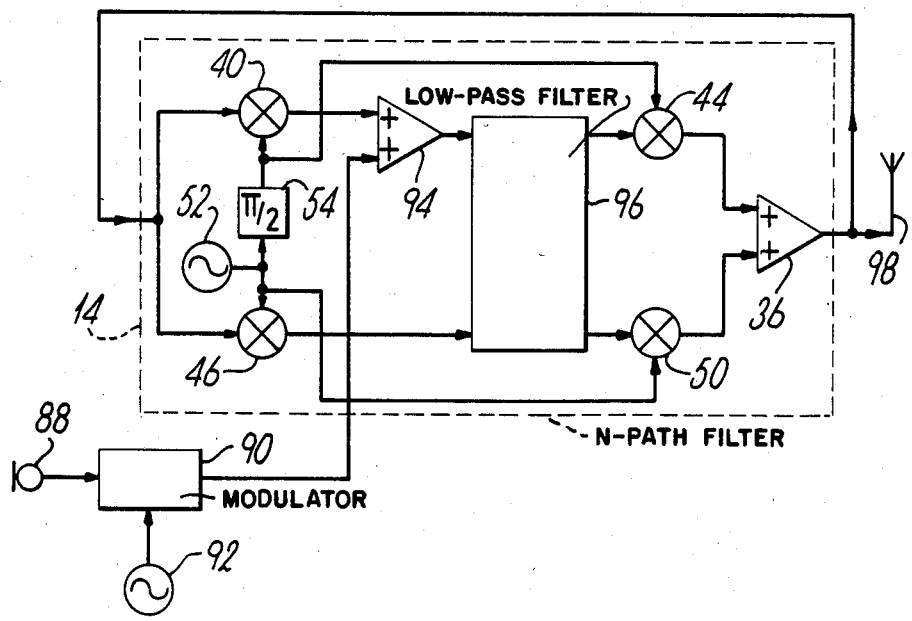
FIG. 13 is a block schematic circuit diagram of a radio transmitter including an N-path filter.

The transmitter shown in FIG. 13 comprises a signal source 88 represented by a microphone, which is connected to a modulator 90. An r.f. signal source 92 is connected to the modulator 90 to frequency up- convert the signal from the source 88. The output of the modulator 90 comprises the wanted and image signals which are applied to a summing arrangement 94 in a low frequency part of an N-path filter 14. The N-path filter 14 may be generaly the same as described with reference to FIG. 2 or may comprise a polyphase filter as described with reference to FIG. 8. The output from the amplifier 36 is fedback to the quadrature related mixers 40, 46 where it is frequency down- converted to the i.f. frequencies. In the case of the output from the mixer 40 this is summed with the i.f. signal in the summing arrangement 94. Thereafter a low pass filtering section 96 of the filter 14 removes the unwanted image signals from the signals applied to its inputs. The filtered output from the section 96 is frequency up-converted to the final r.f. frequency in the mixers 44, 50 before being applied to the summing amplifier 36. The output therefrom provides an output signal which is applied to antenna 98 as well as the feedback signal.

I claim:

1. An improved radio frequency (RF) tuning circuit which suppresses image frequencies of the frequency band to which it is tuned and which comprises: an RF amplifier having an input for RF signals supplied thereto, a feedback signal input, and an output; such output being connected to the input of an N-path filter which includes a local oscillator; and a feedback path connecting the output of said filter to the feedback signal input of said RF amplifier; such improvement being characterized in that said N-path filter comprises:

first and second quadrature related signal paths connecting the output of said RF amplifier to first and second inputs, respectively, of a summing amplifier, said summing amplifier having an output at which it produces output RF signals corresponding to the supplied RF signals, the output of said summing amplifier being connected to said feedback path to supply such output RF signals thereto as feedback signals;

said first signal path including in series a first mixer, a first filter and a second mixer, the output of said second mixer being coupled to the first input of said summing amplifier;

said second signal path including in series a third mixer, a second filter and a fourth mixer, the output of said fourth mixer being coupled to the second input of said summing amplifier;

and phase shift means coupling the output of said local oscillator in quadrature to said first and third mixers, respectively, and in quadrature to said second and fourth mixers, respectively;

such feedback path causing the center frequency of the transfer characteristic of said filter to be displaced from the frequency of said local oscillator therein by an amount determined by the relative gains of said feedback path and said RF amplifier; whereby substantially only a single sideband of the signals produced at the outputs of said third and fourth mixers is included in the output RF signals produced by said summing amplifier.

2. An RF tuning circuit in accordance with claim 1, wherein said feedback signal path includes a feedback amplifier and a low-pass filter.

3. An RF tuning circuit as claimed in claim 1, wherein the filters in said first and second signal paths, respectively, are low pass filters.

4. An RF tuning circuit as claimed in claim 3, wherein an intermediate frequency (IF) output signal is produced at the output of a portion of the filter in one of said signal paths.

5. An RF tuning circuit as claimed in claim 1, further comprising a polyphase filter connecting said first and second signal paths to the first and second inputs, respectively, of said summing amplifier.

6. An RF tuning circuit as claimed in claim 5, wherein said polyphase filter is a polyphase lattice filter.

7. An RF tuning circuit as claimed in claim 1, wherein such tuning circuit is comprised in a radio receiver.

8. An RF tuning circuit as claimed in claim 1, wherein such tuning circuit is comprised in a radio transmitter.

* * * * *